(12) United States Patent
Onodera et al.

(10) Patent No.: US 6,479,338 B2
(45) Date of Patent: Nov. 12, 2002

(54) CMOS DEVICE AND METHOD OF MANUFACTURING THE SAME

(75) Inventors: Shigeki Onodera, Kanagawa (JP); Ichiro Ohashi, Kanagawa (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 0 days.

(21) Appl. No.: 09/996,795

(22) Filed: Nov. 30, 2001

(65) Prior Publication Data

US 2002/0064925 A1 May 30, 2002

Related U.S. Application Data

(62) Division of application No. 09/725,137, filed on Nov. 29, 2000.

(51) Int. Cl.$^7$ ............... H01L 21/336; H01L 21/8238
(52) U.S. Cl. ............... 438/227; 438/232; 438/298; 438/306
(58) Field of Search .................. 438/225, 227, 438/228, 232, 298, 306

(56) References Cited

U.S. PATENT DOCUMENTS 5,028,556 A * 7/1991 Chang ................ 438/218

FOREIGN PATENT DOCUMENTS

JP  57-211264 A  * 12/1982  ........... H01L/27/08

* cited by examiner

Primary Examiner—Carl Whitehead, Jr.
Assistant Examiner—Toniae M. Thomas
(74) Attorney, Agent, or Firm—Whitham, Curtis & Christofferson, P.C.

(57) ABSTRACT

A semiconductor substrate having a first conductivity type is first prepared. Then, a well region is formed in the substrate so as to have a second conductivity type opposite to the first conductivity type. Next, a first ion having the first conductivity type is implanted into the well region to form a region to be a first drain region having a first impurity density and into the substrate to form a region to be a first channel stopper region. Next, a second ion having the second conductivity type is implanted into the well to form a region to be a second channel stopper region and into the substrate to form a region to be a the second drain region having a second impurity density. Then, the respective ion implanted regions are thermally diffused to form the first drain region and the second channel stopper region in the well region and to form the second drain region and the first channel stopper region in the substrate. Next, a third drain region is formed in the first drain region so as to have the first conductivity type and a third impurity density higher than the first impurity density. And a fourth drain region is formed in the second drain region so as to have the second conductivity type and a fourth impurity density higher than the second impurity density.

4 Claims, 4 Drawing Sheets

CMOS DEVICE AND METHOD OF MANUFACTURING THE SAME

REFERENCE TO CROSS RELATED APPLICATIONS

The present application is a divisional application of U.S. application Ser. No. 09/725,13, filed Nov. 29, 2000, which claims priority under 35 U.S.C. §1.20 thereto.

BACKGROUND OF THE INVENTION

The present invention relates to a CMOS (complementary MOS) device wherein a p-channel MOS transistor and an n-channel MOS transistor are formed on the same semiconductor substrate and a method of manufacturing the same.

FIG. 6 is a sectional view showing the general structure of a p-well type of CMOS device. A used silicon (Si) semiconductor substrate 1 is an n-type, and a p-type well 2 is formed deep on the surface. An n-channel MOS transistor (hereinafter called N-MOS) 3 is formed on the surface of the p-type well 2. A p-channel MOS transistor (hereinafter called P-MOS) 4 is formed on the surface of the $n^-$-type semiconductor substrate 1. $n^+$-type regions 5A and 6A to be respectively a drain and a source of the N-MOS 3 are formed shallowly on the surface of the p-type well 2, and $p^+$-type regions 7A and 8A to be respectively a drain and a source of the P-MOS 4 are formed shallowly on the surface of the semiconductor substrate 1. Further, a p-type channel stopper 9 is formed near the N-MOS 3 on the surface of the p-type well 2 and an n-type channel stopper 10 is formed near the P-MOS 4 on the surface of the semiconductor substrate 1 respectively to isolate the N-MOS 3 and the P-MOS4.

Element regions on the surface of the semiconductor substrate 1 having the internal structure described above are isolated by a thick field oxide film ($SiO_2$) 11 and the field oxide film 11 is formed by local oxidation of silicon (LOCOS). A polycrystalline silicon layer 13 to be a gate electrode is formed on a gate oxide film 12 and hatched parts under the gate oxide film 12 respectively compose channel regions 1A and 2A. A boro-phosphosilicate glass (BPSG) film 14 for example is laminated on the surface of the whole device as an insulating film. Metallic wiring layers 15A, 15B and 15C made of aluminum (Al) are laminated on the BPSG film 14. The metallic wiring layers 15A, 15B and 15C are respectively connected to the source/drain regions 5A, 6A, 7A and 8A and the gate electrode 13 via a contact window open to a part of the BPSG film 14 and the oxide film thereunder.

However, in the CMOS device having the structure described above, withstand voltage between the drain and the channel was not enough. That is, there is a problem that in the N-MOS 3, the spread of a depletion layer on the side of $n^+$-type drain 5A is small in operation, an electric field gradient between the drain region 5A and the $p^-$-type channel region 2A becomes steep, the withstand voltage is decreased, also similarly in the P-MOS 4, an electric field gradient between the $p^+$-type drain region 7A and the n-type channel region 1A becomes steep and the withstand voltage is decreased.

SUMMARY OF THE INVENTION

The invention is made in view of the situation described above and the object is to provide a CMOS device in which withstand voltage between its drain and its channel is increased.

Also, another object of the invention is to provide a CMOS device manufacturing method for readily forming the CMOS device.

In order to achieve the above object, according to the present invention, there is provided a CMOS device comprising:

a p-channel MOS transistor including a first p-type drain region provided with a first p-type impurity density;

a n-channel MOS transistor including a first n-type drain region provided with a first n-type impurity density, a second p-type drain region formed in the first p-type drain region, and provided with a second p-type impurity density higher than the first p-type impurity density; and a second n-type drain region formed in the first n-type drain region, and provided with a second n-type impurity density higher than the first n-type impurity density.

The CMOS device according to the invention is based upon a CMOS device having both a p-channel MOS transistor and an n-channel MOS transistor and is characterized in that the same conductive type of low density region is added to the drain region of the respective transistors to achieve the objects.

In this configuration, high impurity density regions are added to the respective drain regions, an electric field gradient between the drain region and the channel region under the operation of the device is made gentle and the withstand voltage is increased.

According to the present invention, there is also provided a method of manufacturing a CMOS device comprising the steps of:

preparing a semiconductor substrate having a first conductivity type;

forming a well region in the substrate, the well having a second conductivity type opposite to the first conductivity type;

implanting a first ion having the first conductivity type, into the well region to form a region to be a first drain region having a first impurity density and into the substrate to form a region to be a first channel stopper region;

implanting a second ion having the second conductivity type, into the well to form a region to be a second channel stopper region and into the substrate to form a region to be a the second drain region having a second impurity density;

thermally diffusing the respective ion implanted regions to form the first drain region and the second channel stopper region in the well region and to form the second drain region and the first channel stopper region in the substrate;

forming a third drain region in the first drain region so as to have the first conductivity type and a third impurity density higher than the first impurity density; and forming a fourth drain region in the second drain region so as to have the second conductivity type and a fourth impurity density higher than the second impurity density.

In this configuration, to form the first and second drain regions, a new process is not required and the first and second drain regions can be formed in the same process for forming a channel stopper region.

DETAILED DESCRIPTION OF THE PREFERRED EMBODIMENTS

Figure 1A:
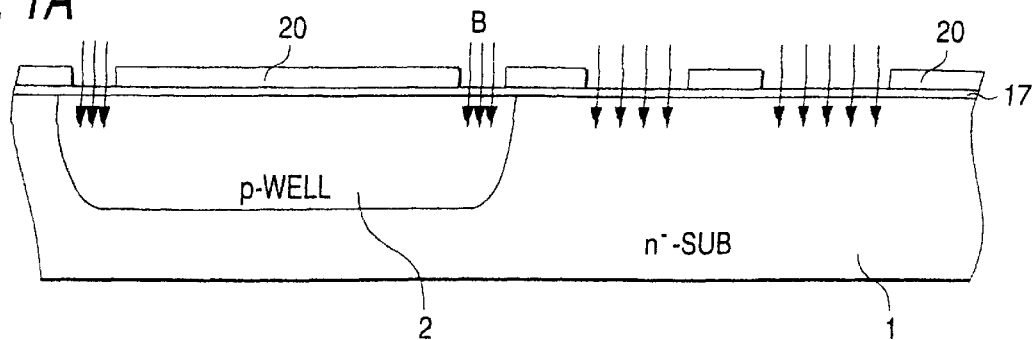
FIGS. 1A to 4 are drawings for explaining a manufacturing method of a CMOS device according to one embodiment of the invention.

Referring to the drawings, a manufacturing method of a CMOS device according to one embodiment of the invention will be described below.

A CMOS device is manufactured via each process shown in the accompanying drawings after a pattern to be a p-type well region is formed on an oxide film using photoresist after n-type single crystal silicon is cut into a wafer, the surface is polished to be a mirror finished surface, the wafer is exposed to a high-temperature oxygen atmosphere and the oxide film made of silicon is grown, impurities for a p-type well are doped, are thermally diffused and the p-type well is formed (in a p-type well formation process).

Figure 1B:
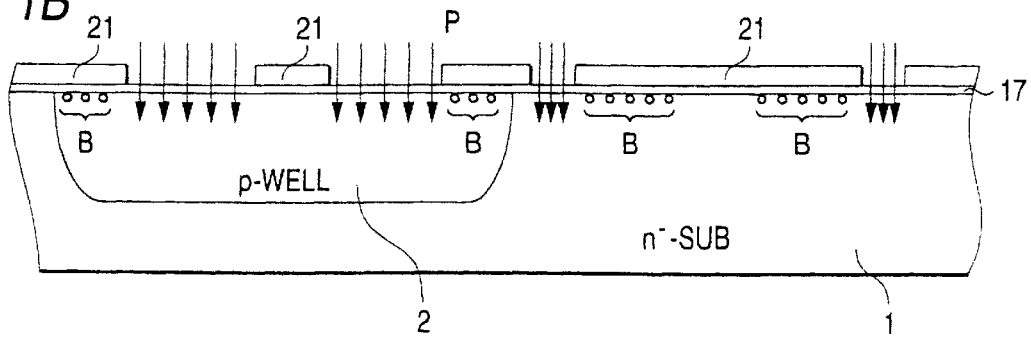
Figure 1C:
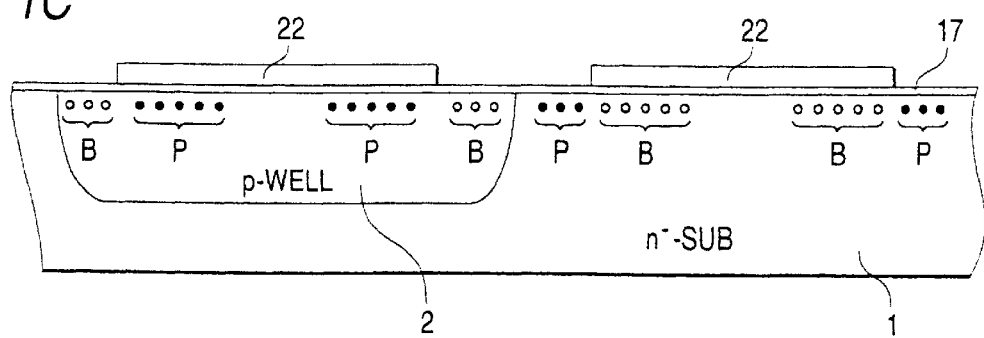
Figure 1D:
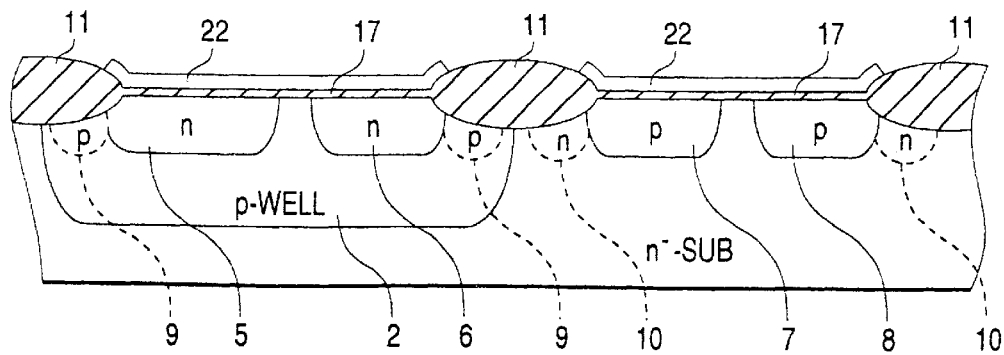

As shown in FIG. 1A, a pad oxide film 17 is formed on the well 2 and a semiconductor substrate 1 and resist 20 is formed on the oxide film 17. Boron (B) ions are implanted through the pad oxide film 17 from an opening between the resists 20 as shown by arrows to form a channel stopper in the p-type well 2 and to respectively form a low density drain region and a low density source region in a required location on the surface of the n-type semiconductor substrate 1. Next, as shown in FIG. 1B, phosphorus (P) ions are implanted through the pad oxide film from an opening between resists 21 to respectively form a low density drain region and a low density source region in the well 2 and to form a channel stopper in a required location on the surface of the semiconductor substrate 1. Next, as shown in FIGS. 1C and 1D, a nitride film 22 is formed on a low density drain formation region and a low density source formation region, heat is applied to form a field oxide film 11 utilizing the nitride film 22. Simultaneously, the boron (B) ions and the phosphorus (P) ions respectively implanted are diffused, and the low density drain region 5, the low density source region 6 and the channel stopper 9 respectively of N-MOS, the low density drain region 7, the low density source region 8 and the channel stopper 10 respectively of P-MOS 4 are formed.

Figure 2A:
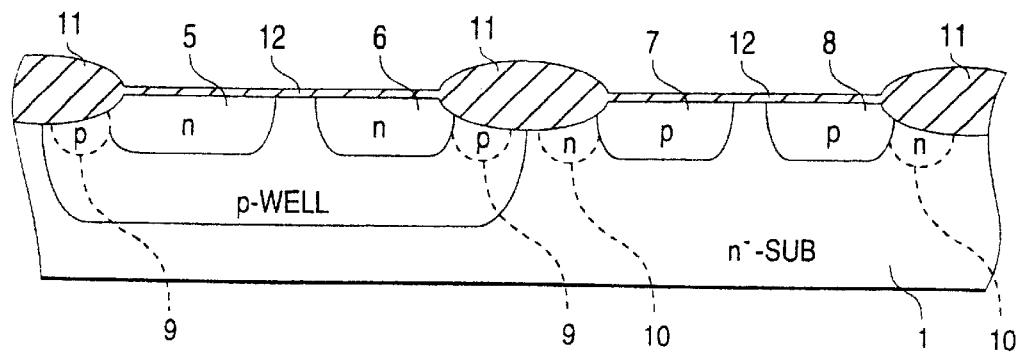
Figure 2B:
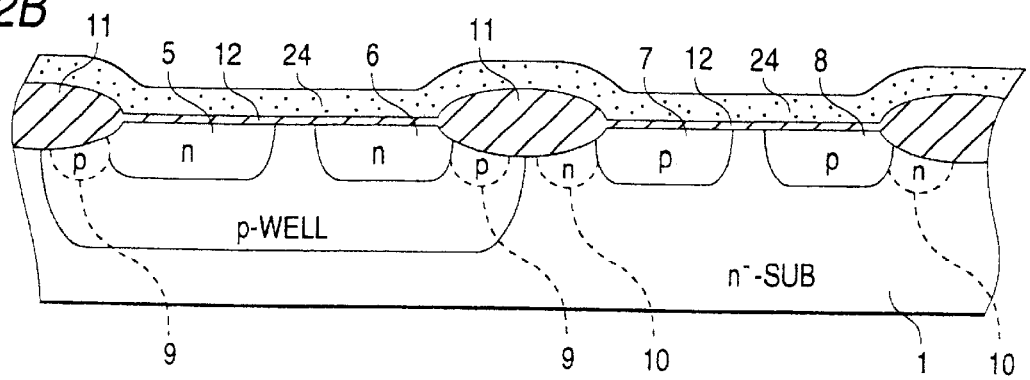
Figure 2C:
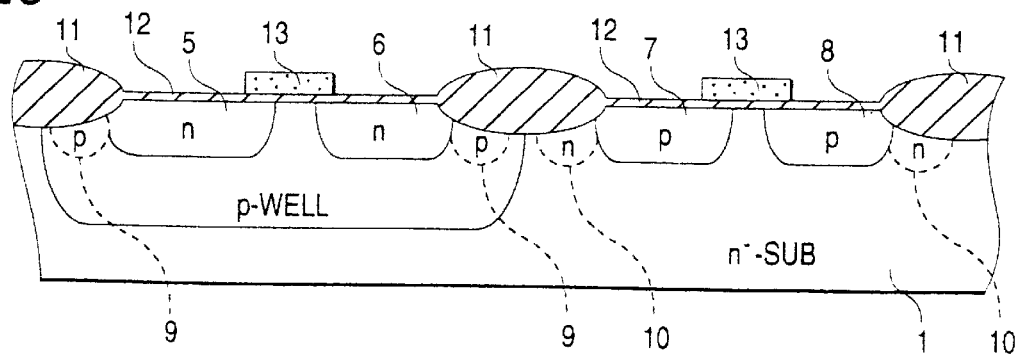
Figure 2D:
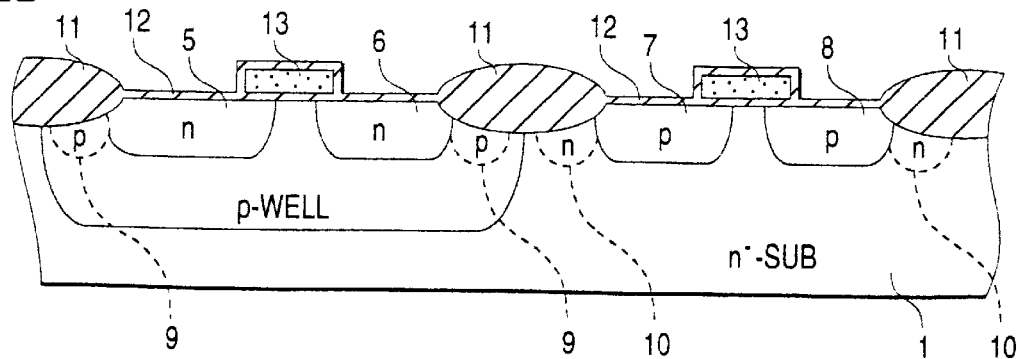

Next, as shown in FIGS. 2A and 2B, after the nitride film 22 and the oxide film 17 are removed and a gate oxide film 12 is formed, a conductive polycrystalline silicon layer 24 is formed on the upper surface. Next, as shown in FIGS. 2C and 2D; an unnecessary part of the polycrystalline silicon layer 24 is removed and a gate electrode 13 is formed, then an oxide layer is formed so as to cover the gate electrode 13.

Figure 3:
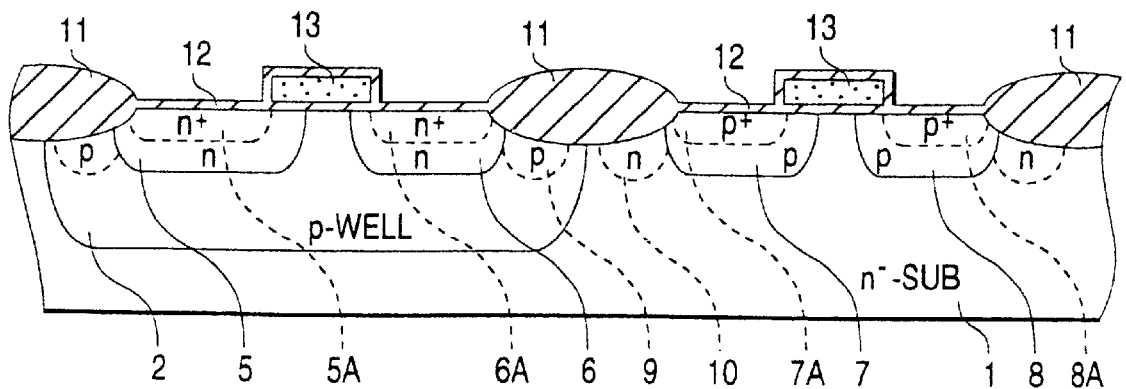

Next, as shown in FIG. 3, an n$^+$-type drain region 5A and an n$^+$-type source region 6A are respectively formed through the oxide film 12 in the low density drain region 5 and the low density source region 6 respectively of N-MOS 3. Next, a p$^+$-type drain region 7A and a p$^+$-type source region 8A are respectively formed in the low density drain region 7 and the low density source region 8 respectively of P-MOS 4 via the oxide film 12.

Figure 4:
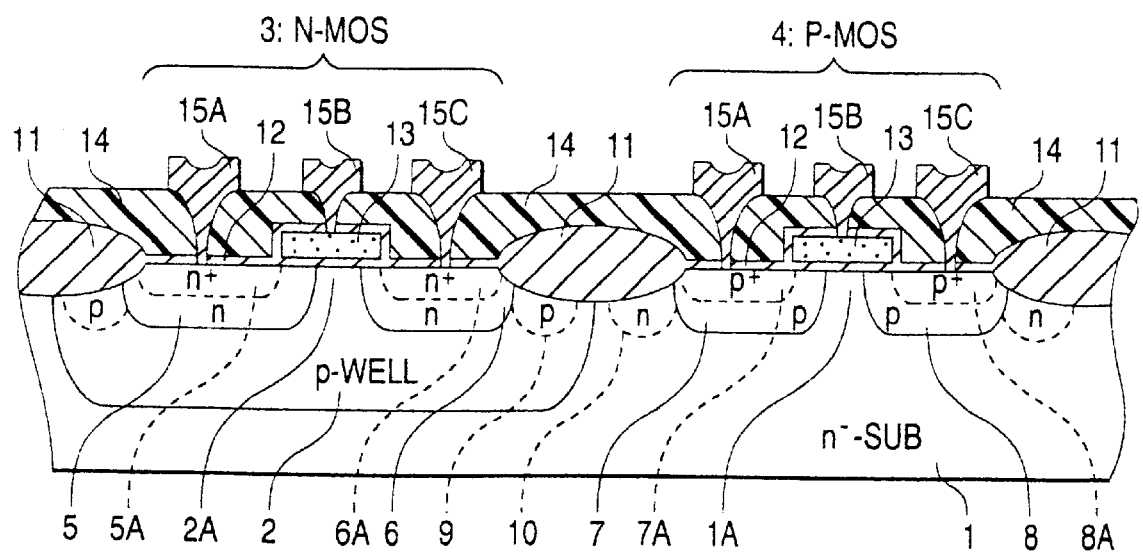

Next, as shown in FIG. 4, an insulating film 14 is laminated and afterward, metallic wiring layers 15A, 15B and 15C made of aluminum (Al) are laminated on the film 14. The metallic wiring layers 15A, 15B and 15C are respectively connected to the source/drain regions 5A, 6A, 7A and 8A and the gate electrode 13 via a contact window open to a part of the film 14 and the oxide film thereunder. The CMOS device is formed by the manufacturing process described above.

Figure 5:
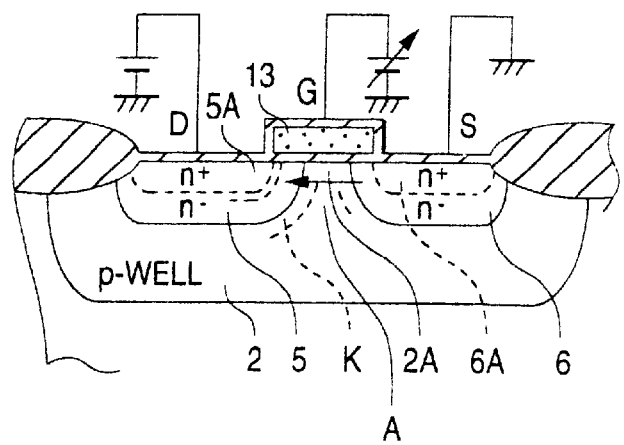
FIG. 5 is an explanatory drawing for explaining the operation of the manufactured CMOS device.
Figure 6:
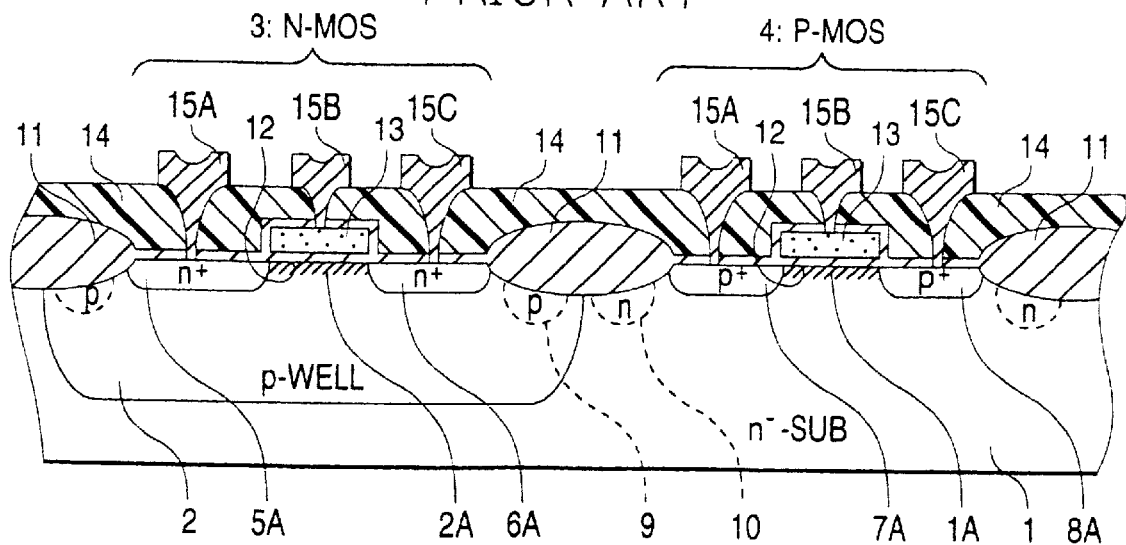
FIG. 6 is an explanatory drawing for explaining a general prior art configuration of a related CMOS device.

In the CMOS device formed in the manufacturing process, a reversed electric field is applied between the high density drain region 5A and the channel region 2A under the operation of the N-MOS 3 as shown in FIG. 5 and at that time, a depletion layer K is generated. Also, the depletion layer K is spread in the direction of the low density drain region 5 as shown by an arrow A, as a result, an electric field gradient between the drain region and the channel region is made gentle and the withstand voltage is increased. The withstand voltage between the drain region 7 and the channel region 1A of the P-MOS 4 is also similarly increased.

In addition, the high density drain region 5A decreases resistance caused in the drain region. The high density drain 7A of the P-MOS 4 also similarly decreases resistance in the drain region therein.

Furthermore, the manufacture is enabled without increasing the number of processes for forming the low density drain regions 5 and 7 and the low density source regions 6 and 8, compared with the related CMOS device manufacturing process in which the channel stopper region 10 is formed after the nitride film 22 shown in FIG. 1C is formed. According to the present invention, in the case of the N-MOS 3, a region to be the channel stopper region 10 is formed at the same time as a region to be the n-type drain/source regions 5 and 6 are formed shown in FIG. 1B. In the case of P-MOS 4, a region to be the channel stopper 9 is formed at the same time as a region to be the p-type drain/source regions 7 and 8 are formed shown in FIG. 1A. Namely, the drain/source formation process is conducted at the same time as the channel stopper formation process before the nitride film 22 is formed.

When the channel stopper layers are formed, a resistive element for example can be also shared.

Although the present invention has been shown and described with reference to specific preferred embodiments, various changes and modifications will be apparent to those skilled in the art from the teachings herein. Such changes and modifications as are obvious are deemed to come within the spirit, scope and contemplation of the invention as defined in the appended claims.

What is claimed is:

1. A method of manufacturing a CMOS device comprising the steps of:

preparing a semiconductor substrate having a first conductivity type;

forming a well region in the substrate, the well having a second conductivity type opposite to the first conductivity type;

implanting first ions having the first conductivity type, simultaneously into the well region to form a region to be a first drain region having a first impurity density and into the substrate to form a region to be a first channel stopper region;

implanting second ions having the second conductivity type, simultaneously into the well to form a region to be a second channel stopper region and into the substrate to form a region to be a second drain region having a second impurity density;

thermally diffusing the respective ion implanted regions to form the first drain region and the second channel stopper region in the well region and to form the second drain region and the first channel stopper region in the substrate;

forming a third drain region in the first drain region so as to have the first conductivity type and a third impurity density higher than the first impurity density; and forming a fourth drain region in the second drain region so as to have the second conductivity type and a fourth impurity density higher than the second impurity density.

2. The manufacturing method as set forth in claim 1, wherein the first conductivity type is n-type and the second conductivity type is p-type.

3. The manufacturing method as set forth in claim 1, wherein the first conductivity type is p-type and the second conductivity type is n-type.

4. The manufacturing method as set forth in claim 1 wherein one of said step of forming said third drain region and said step of forming said fourth drain region includes a step of implantation of impurities of one of said first conductivity type and said second conductivity type, respectively.

* * * * *